(12) United States Patent
Ahn

(10) Patent No.: US 11,968,912 B2
(45) Date of Patent: Apr. 23, 2024

(54) SPUTTERING TARGET INCLUDING CARBON-DOPED GST AND METHOD FOR FABRICATING ELECTRONIC DEVICE USING THE SAME

(71) Applicant: SK hynix Inc., Icheon (KR)

(72) Inventor: Jun Ku Ahn, Icheon (KR)

(73) Assignee: SK hynix Inc., Icheon (KR)

( * ) Notice: Subject to any disclaimer, the term of this patent is extended or adjusted under 35 U.S.C. 154(b) by 240 days.

(21) Appl. No.: 17/324,833

(22) Filed: May 19, 2021

(65) Prior Publication Data

US 2022/0190241 A1    Jun. 16, 2022

(30) Foreign Application Priority Data

Dec. 16, 2020    (KR) .................. 10-2020-0176290

(51) Int. Cl.
*H10B 63/00*    (2023.01)
*C23C 14/06*    (2006.01)
*C23C 14/34*    (2006.01)
*H10N 70/00*    (2023.01)

(52) U.S. Cl.
CPC ....... *H10N 70/026* (2023.02); *C23C 14/0623* (2013.01); *C23C 14/3414* (2013.01); *H10B 63/00* (2023.02); *H10N 70/8828* (2023.02)

(58) Field of Classification Search
None
See application file for complete search history.

(56) References Cited

U.S. PATENT DOCUMENTS

| 2005/0031484 A1* | 2/2005 | Nonaka | C23C 14/3414 257/E45.002 |
| 2008/0075844 A1* | 3/2008 | Ha | H10B 63/30 423/364 |
| 2012/0279857 A1 | 11/2012 | Takahashi et al. | |

FOREIGN PATENT DOCUMENTS

| CN | 110844892 A | 2/2020 |
| JP | 2009228061 A | 10/2009 |
| KR | 1020080016120 A | 2/2008 |
| KR | 101356280 01 | 1/2014 |
| WO | WO2020195812 A | 10/2020 |

\* cited by examiner

*Primary Examiner* — Jay C Chang

(57) ABSTRACT

A sputtering target and a method for fabricating an electronic device using the same are provided. A sputtering target may include a carbon-doped GeSbTe alloy, wherein, for the carbon-doped GeSbTe alloy, an average grain diameter of a GeSbTe alloy after sintering is in a range of 0.5 μm to 5 μm, and a first ratio of an average grain diameter of carbon after the sintering is Y (μm) to the average grain diameter of the GeSbTe alloy after the sintering may be in a range of greater than 0.5 and equal to or less than 1.5. Alternatively, for the carbon-doped GeSbTe alloy, a condition of Y=X×(Z/100) may be satisfied, where an average grain diameter of a GeSbTe alloy after sintering is X (μm), an average grain diameter of carbon after the sintering is Y (μm), and a content of carbon is Z (at %).

10 Claims, 6 Drawing Sheets

SPUTTERING TARGET INCLUDING CARBON-DOPED GST AND METHOD FOR FABRICATING ELECTRONIC DEVICE USING THE SAME

CROSS-REFERENCE TO RELATED APPLICATION

This patent document claims the priority and benefits of Korean Patent Application No. 10-2020-0176290, entitled "SPUTTERING TARGET INCLUDING CARBON-DOPED GeSbTe AND METHOD FOR FABRICATING ELECTRONIC DEVICE USING THE SAME" and filed on Dec. 16, 2020, which is incorporated herein by reference in its entirety.

TECHNICAL FIELD

The embodiments of the disclosed technology relate to memory circuits or devices and their applications in electronic devices or systems.

BACKGROUND

As electronic devices such as personal computers, mobile devices, or the like trend toward miniaturization, low power consumption, high performance, multi-functionality, memory devices capable of storing data in various electronic devices have been in demand. Thus, research has been conducted for developing memory devices having switching characteristics, i.e., devices capable of storing data by switching between different resistance states according to an applied voltage or current. Examples of memory devices include an RRAM (resistive random access memory), a PRAM (phase change random access memory), an FRAM (ferroelectric random access memory), an MRAM (magnetic random access memory), an E-fuse, and the like.

SUMMARY

The embodiments of the disclosed technology in this patent document relate to memory circuits or devices and their applications in electronic devices or systems. The disclosed technology can be used in some implementations to provide a sputtering target and a method for fabricating an electronic device using the sputtering target, which can improve characteristics of a variable resistance layer.

In one aspect, a sputtering target may include a carbon-doped GeSbTe alloy, wherein, for the carbon-doped GeSbTe alloy, an average grain diameter of a GeSbTe alloy after sintering may be in a range of 0.5 μm to 5 μm, and a first ratio of an average grain diameter of carbon after the sintering to the average grain diameter of the GeSbTe alloy after the sintering may be in a range of greater than 0.5 and equal to or less than 1.5.

In another aspect, a sputtering target may include a carbon-doped GeSbTe alloy, wherein, for the carbon-doped GeSbTe alloy, a condition of $Y=X\times(Z/100)$ may be satisfied, where an average grain diameter of the GeSbTe alloy after the sintering is X (μm), an average grain diameter of carbon after sintering is Y (μm), and a content of carbon is Z (at %).

In another aspect, a method for fabricating an electronic device comprising a semiconductor memory may comprise: forming a first electrode layer over a substrate; forming a phase change material layer including a carbon-doped GeSbTe alloy over the first electrode layer; and forming a second electrode layer over the phase change material layer, wherein the phase change material layer is formed by a sputtering process using a sputtering target, the sputtering target including the carbon-doped GeSbTe alloy, and wherein, for the carbon-doped GeSbTe alloy, an average grain diameter of a GeSbTe alloy after sintering may be in a range of 0.5 μm to 5 μm, and a first ratio of an average grain diameter of carbon after the sintering to the average grain diameter of the GeSbTe alloy after the sintering is may be in a range of greater than 0.5 and equal to or less than 1.5 or less.

In another aspect, a method for fabricating an electronic device comprising a semiconductor memory may comprise: forming a first electrode layer over a substrate; forming a phase change material layer including a carbon-doped GeSbTe alloy over the first electrode layer; and forming a second electrode layer over the phase change material layer, wherein the phase change material layer is formed by a sputtering process using a sputtering target, the sputtering target including the carbon-doped GeSbTe alloy, and wherein, for the carbon-doped GeSbTe alloy, a condition of $Y=X\times(Z/100)$ may be satisfied, where an average grain diameter of a GeSbTe alloy after sintering is X (μm), an average grain diameter of carbon after the sintering is Y (μm), and a content of carbon is Z (at %)

In still another aspect, a method for fabricating an electronic device comprising a semiconductor memory may comprise: forming a plurality of first lines over a substrate, each first line extending in a first direction; forming a plurality of memory cells over the first lines; and forming a plurality of second lines over the memory cells, each second line extending in a second direction that crosses the first direction, the first and second directions being perpendicular to a top surface of the substrate, wherein the memory cells may be disposed at respective intersections of the plurality of first lines and the plurality of second lines, and each of the memory cells may include a variable resistance layer switching between different resistance states according to an applied voltage or current, and a selection element layer controlling access to the variable resistance layer, wherein forming the plurality of memory cells includes forming the variable resistance layer may be formed by a sputtering process using a sputtering target, the sputtering target including a carbon-doped GeSbTe alloy, wherein, for the carbon-doped GeSbTe alloy, an average grain diameter of a GeSbTe alloy after sintering may be in a range of 0.5 μm to 5 μm, and a first ratio of an average grain diameter of carbon after the sintering to the average grain diameter of the GeSbTe alloy after the sintering may be in a range of greater than 0.5 and equal to or less than 1.5.

In still another aspect, a method for fabricating an electronic device comprising a semiconductor memory may comprise: forming a plurality of first lines over a substrate, each first line extending in a first direction; forming a plurality of memory cells over the first lines; and forming a plurality of second lines over the memory cells, each second line extending in a second direction that crosses the first direction, the first and second directions being perpendicular to a top surface of the substrate, wherein the memory cells may be disposed at respective intersections of the plurality of first lines and the plurality of second lines, and each of the memory cell may include a variable resistance layer switching between different resistance states according to an applied voltage or current, and a selection element layer controlling access to the variable resistance layer, wherein forming a plurality of memory cells includes forming the variable resistance layer by a sputtering process using a sputtering target, the sputtering target including a carbon-doped GeSbTe alloy, and wherein, wherein, for the carbon-doped GeSbTe alloy, a condition of Y=X×(Z/100) may be satisfied, where an average grain diameter of the GeSbTe alloy after sintering is X ($\mu$m), an average grain diameter of carbon after the sintering is Y ($\mu$m), and a content of carbon is Z (at %)

These and other aspects, implementations and associated advantages are described in greater detail in the drawings, the description and the claims.

DETAILED DESCRIPTION

Figure 1:
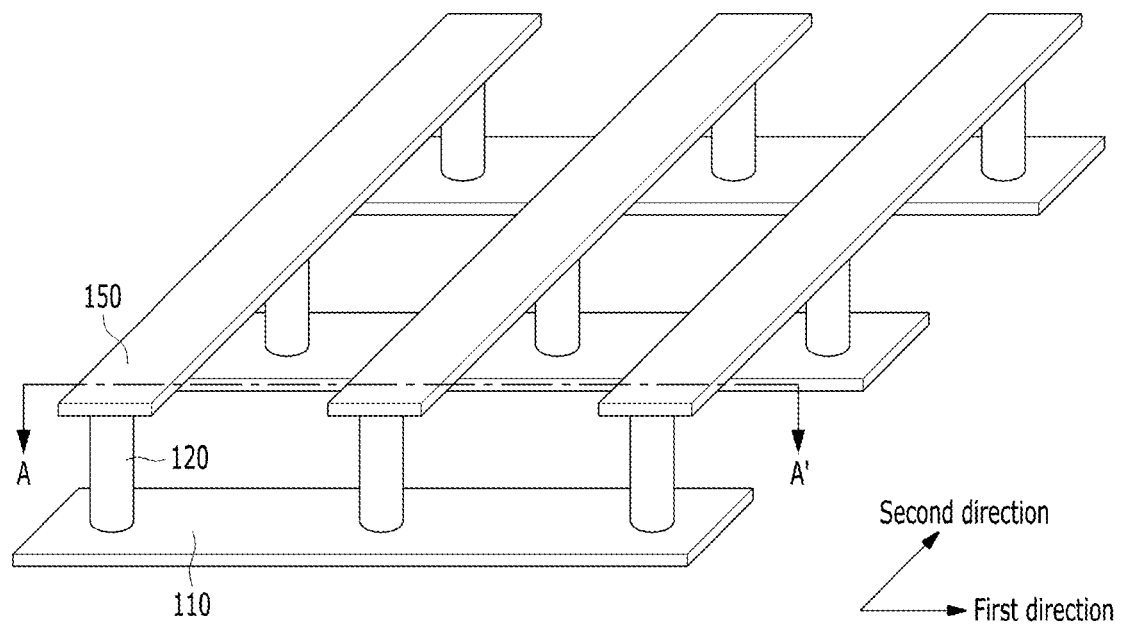
FIG. 1 is a perspective view illustrating a semiconductor memory according to an implementation of the disclosed technology.

Various examples and implementations of the disclosed technology are described below in detail with reference to the accompanying drawings.

The drawings may not be necessarily to scale and in some instances, proportions of at least some of substrates in the drawings may have been exaggerated to illustrate certain features of the described examples or implementations. In presenting a specific example in a drawing or description having two or more layers in a multi-layer substrate, the relative positioning relationship of such layers or the sequence of arranging the layers as shown reflects a particular implementation for the described or illustrated example and a different relative positioning relationship or sequence of arranging the layers may be possible.

As semiconductor devices capable of storing data using specific materials that have different resistance states according to an applied voltage or current, an RRAM, a PRAM, an FRAM, an MRAM, and an E-use have been developed.

The PRAM includes a phase change material layer as a variable resistance layer. A crystalline state of the phase change material layer is changed by heat and thus its resistance is changed. The crystalline state of the phase change material layer may be changed mainly depending on an amount and a supply time of a current supplied thereto. The phase change material layer may include a chalcogenide material containing germanium (Ge), antimony (Sb), and tellurium (Te), which is also referred to as 'GeSbTe' or 'GST.' A phase change material layer including a GeSbTe alloy may be commonly formed by a physical vapor deposition. For example, the phase change material layer may be formed by a sputtering process using a sputtering target that is made of an alloy to be included in the phase change material layer.

The sputtering target including the GeSbTe alloy may be formed by mixing Ge powders, Sb powders and Te powders according to a composition ratio, and then sintering the mixed powders.

Recently, it has been proposed to form a phase change material layer including a carbon-doped GeSbTe alloy by sputtering a target containing a chalcogenide material with carbon in order to improve an electrical characteristic of the PRAM. By using the carbon-doped GeSbTe alloy to form the phase change material layer, it is possible to increase an electrical resistance of the phase change material layer and to reduce a current flowing through the phase change material layer, thereby decreasing power consumption.

However, since carbon is not a metal and does not form an alloy with GeSbTe, when a sputtering process is performed using a sputtering target including the carbon-doped GeSbTe alloy, an abnormal structure is generated on a surface of the sputtering target, a quality of a thin film formed by the suppering process, e.g., uniformity of the thin film, is deteriorated due to particles incorporated into the thin film, and thus a manufacturing yield of the PRAM is reduced.

In implementations of the disclosed technology, when forming a thin film by the sputtering process using the sputtering target including the carbon-doped GeSbTe alloy, a consolidation quality between carbon and GeSbTe can be controlled. Thus, it is possible to significantly reduce an occurrence of particle defects due to a quality of the sputtering target and thus to improve the manufacturing yield of the PRAM.

In accordance with an implementation of the disclosed technology, when forming a thin film by the sputtering process using the sputtering target including the carbon-doped GeSbTe alloy, it is possible to achieve uniformity and refinement of grain sizes of carbon and the GeSbTe alloy in a sintered sputtering target. As a result, an occurrence of particle defects due to the quality of the sputtering target can be suppressed.

In accordance with another implementation of the disclosed technology, when forming a thin film by the sputtering process using the sputtering target including the carbon-doped GeSbTe alloy, it is possible to control a grain size of carbon relative to a grain size of the GeSbTe alloy in the sintered sputtering target according to the doped carbon content. As a result, an occurrence of particle defects due to the quality of the sputtering target can be suppressed.

Hereinafter, sputtering targets in accordance with implementations of the disclosed technology will be described.

In accordance with an implementation, the sputtering target may include the carbon-doped GeSbTe alloy. When forming the carbon-doped GeSbTe alloy, an average grain diameter X ($\mu$m) of the GeSbTe alloy after sintering is in a range of 0.5 $\mu$m to 5 $\mu$m and a ratio of an average grain diameter of carbon after the sintering (Y ($\mu$m)) to the average grain diameter of the GeSbTe alloy after the sintering (X ($\mu$m)), i.e., Y/X, is a value in a range of greater than 0.5 and equal to or less than 1.5.

The sputtering target including the carbon-doped GeSbTe alloy may be used to form a phase change recording film or phase change material layer including the carbon-doped GeSbTe alloy.

The above conditions of X and Y/X can be satisfied by the sputtering target, can be set so as to refine the grain sizes of carbon and the GeSbTe alloy after the sintering and simultaneously to increase uniformity of the grain sizes, thereby suppressing generation of particles during the sputtering process.

The sputtering target may be manufactured by powder mixing of materials included in the sputtering target and sintering, for example, pressurized sintering. Considering the manufacturing method of the sputtering target, the grain size of carbon may be determined when performing the powder mixing rather than the pressurized sintering and a grain growth in the GeSbTe alloy may occur when performing the pressurized sintering. Further, in the process of manufacturing the sputtering target, carbon may also be aggregated to form an aggregate and thus the grain size of carbon may increase. Therefore, it is preferable to adjust grain sizes of carbon particles and the aggregate to be the same as or similar to the grain size of the GeSbTe alloy after the sintering rather than unconditionally adjusting the grain size of carbon.

In the implementation of the disclosed technology, the average grain diameter of the GeSbTe alloy after the sintering (X (μm)) may be in a range of 0.5 μm to 5 μm, preferably in a range of 0.5 μm to 3 μm, or more preferably in a range of 0.5 μm to 1.5 μm. When X is smaller than the above range, gas components such as oxygen absorbed in a target powder manufacturing process may affect a quality of the sputtering target, thereby increasing defects due to impurities, manufacturing difficulties, and manufacturing costs. When X is greater than the above range, the doped carbon may be aggregated in the sputtering target and thus, the composition of the materials in the sputtering target may be uneven.

In the implementation of the disclosed technology, the ratio Y/X of the average grain diameter of carbon after the sintering to the average grain diameter of the GeSbTe alloy after the sintering may have a value in a range of greater than 0.5 and equal to or less than 1.5, preferably in a range of 0.8 to 1.2, more preferably in a range of 0.9 to 1.1, most preferably about 1. When the ratio Y/X is out of the above range, nonuniformity between the grain sizes of the GeSbTe alloy and carbon becomes increased, so that particles may be generated during the sputtering process.

In one implementation, a case in which X is about 0.5 μm, Y is about 0.5 μm, and Y/X is about 1 may be preferred.

As described above, since carbon particles may be aggregated in the process of forming the sputtering target by the powder mixing and the pressurized sintering, after the sintering, carbon may exist in the form of particles and/or in the form of aggregate. Therefore, the average grain diameter of carbon after the sintering may mean the average grain diameter of carbon particles after the sintering and also mean the average grain diameter of carbon aggregate after the sintering.

In one implementation, in case that an average powder diameter of the GeSbTe alloy before the sintering is X' and an average powder diameter of carbon before the sintering is Y', it may be desirable that Y'/X' has a value close to 1, in view of closed packing. For example, Y'/X' may have a value in a range of greater than 0.5 and equal to or less than 1.5, preferably in a range of 0.8 to 1.2, more preferably in a range of 0.9 to 1.1, most preferably about 1. When Y'/X' has a value close to 1, powders can be closely packed due to uniformity of the powder size during the sintering process, thereby improving a quality of the sputtering target.

In one implementation, the carbon-doped GeSbTe alloy may include 5 to 25 at % of germanium (Ge), 20 to 40 at % of antimony (Sb), 40 to 60 at % of tellurium (Te), and 0.1 to 20 at % of carbon (C).

In one implementation, the carbon content may be 0.1 to 10 at %. Carbon may serve to increase resistance of the phase change material layer including the GeSbTe alloy. Accordingly, when the carbon content is greater than the above range, a mechanical strength of the sputtering target is decreased due to decrease in a density of the sputtering target, thereby causing problems such as cracks during the sputtering process.

As described above, the sputtering target may be formed by the powder mixing and the sintering.

For example, germanium (Ge) powders, antimony (Sb) powders, and tellurium (Te) powders may be mixed according to the alloy composition ratio, and then carbon (C) powders may be added to the mixed powders according to the desired carbon content.

For example, an alloy containing Ge, Sb, and Te may be gas atomized or mechanically pulverized into powders, and then the carbon (C) powders may be added to the alloy powders according to the desired carbon content.

A particle size of the mixed powders containing the germanium (Ge) powders, the antimony (Sb) powders, and the tellurium (Te) powders and a particle size of the carbon (C) powders can be controlled so that the average grain diameter of the GeSbTe alloy after the sintering (X) is in a range of 0.5 μm to 5 μm and the ratio Y/X is a value in a range of greater than 0.5 and equal to or less than 1.5, comprehensively considering the grain growth of the GeSbTe alloy and the formation of carbon aggregates during the manufacturing process.

In the powder mixing, a solvent may be added. Examples of the solvent may include deionized water, alcohol, acetone, and so on. When the solvent is added, it may be removed by performing a drying process after the powder mixing.

The mixed powders may be sintered as they are. Alternatively, the mixed powders may be sintered after being molded into a predetermined target shape.

The sintering process may include one of a sintering process using a furnace, a high temperature pressurized sintering process, a high temperature static pressure sintering process, and a reactive high temperature pressurized sintering process. The sintering process may be performed under an inert gas atmosphere or a reducing gas atmosphere.

The manufacturing process of the sputtering target should be carried out so as to satisfy the condition that the average grain diameter of the GeSbTe alloy after the sintering (X) is in a range of 0.5 μm to 5 μm and the ratio Y/X is in a range of 0.5 to 1.5.

The sputtering target in accordance with another implementation of the disclosed technology may include the carbon-doped GeSbTe alloy. In case that the average grain diameter of the GeSbTe alloy after the sintering is X (μm), the average grain diameter of carbon after the sintering is Y (μm), and the content of carbon is Z (at %), the condition of Y=X×(Z/100) can be satisfied.

The sputtering target including the carbon-doped GeSbTe alloy may be used to form a phase change recording film or phase change material layer including the carbon-doped GeSbTe alloy.

The conditions of X (the average grain diameter of the GeSbTe alloy after the sintering), Y (the average grain diameter of carbon after the sintering) and Z (the carbon content), which are satisfied by the sputtering target in accordance with the implementation of the disclosed technology, may be set so as to control the grain size of carbon relative to the grain size of the GeSbTe alloy in the sintered sputtering target according to the carbon content, thereby suppressing generation of particles during the sputtering process.

In the implementation of the disclosed technology, the grain size of carbon after the sintering may be determined relative to the grain size of the GeSbTe alloy after the sintering according to the carbon content. That is, X, Y, and Z should satisfy the condition of $Y=X\times(Z/100)$. When the average grain diameter of carbon after the sintering (Y) is greater than the above condition, a composition of the doped carbon may be nonuniform. When the average grain diameter of carbon after the sintering (Y) is smaller than the above condition, the average grain size of carbon is too small and thus cannot be practically applied.

For example, when X is 1 μm and Z is 5 at %, Y is X×Z, that is, 0.05 μm, and Y/X is 0.05. Further, when X is 1 μm and Z is 10 at %, Y is X×Z, that is, 0.1 μm, and Y/X is 0.1.

As such, in the implementation, it is possible to prevent the composition of the doped carbon from being formed unevenly and to achieve a uniform distribution by adjusting the average grain size of carbon after the sintering relative to the average grain size of the GeSbTe alloy after the sintering according to the carbon content. As a result, a quality of the sputtering target can be improved, so that particle generation due to deterioration of the quality of the sputtering target during the sputtering process can be effectively suppressed.

As described above, since carbon particles may be aggregated while forming the sputtering target by the powder mixing and the pressurized sintering, after sintering, carbon may exist in the form of particles and/or in the form of aggregate. Therefore, the average grain diameter of carbon after the sintering may mean the average grain diameter of carbon particles after the sintering and also mean the average grain diameter of carbon aggregate after the sintering.

In one implementation, the average grain diameter of the GeSbTe alloy after the sintering (X) may be in a range of 0.5 μm to 30 μm, preferably in a range of 0.5 μm to 10 μm, more preferably in a range of 0.5 μm to 5 μm, most preferably 0.5 μm to 1.5 μm. When X is smaller than the above range, gas components such as oxygen absorbed in a target powder manufacturing process may affect a quality of the sputtering target, thereby increasing defects due to impurities, manufacturing difficulties, and manufacturing costs. When X is greater than the above range, the grain size of the GeSbTe alloy and the grain size of carbon become too large, so that the carbon composition may be formed unevenly.

In one implementation, the carbon-doped GeSbTe alloy may include 5 to 25 at % of germanium (Ge), 20 to 40 at % of antimony (Sb), 40 to 60 at % of tellurium (Te), and 0.1 to 20 at % of carbon (C).

In one implementation, the carbon (C) content may be 0.1 to 10 at %. Carbon may serve to increase resistance of the phase change material layer including the GeSbTe alloy. Accordingly, when the carbon (C) content is greater than the above range, a mechanical strength of the sputtering target is decreased due to decrease in a density of the sputtering target, thereby causing problems such as cracks during the sputtering process.

As described in the above-described implementations, the sputtering target may be formed by the powder mixing and the sintering.

For example, germanium (Ge) powders, antimony (Sb) powders, and tellurium (Te) powders may be mixed according to the alloy composition ratio, and then carbon (C) powders may be added to the mixed powders according to the desired carbon content.

For example, an alloy containing Ge, Sb, and Te may be gas atomized or mechanically pulverized into powders, and then the carbon (C) powders may be added to the alloy powders according to the desired carbon content.

A particle size of the mixed powders containing the germanium (Ge) powders, the antimony (Sb) powders, and the tellurium (Te) powders and a particle size of the carbon (C) powder can be controlled so as to satisfy the condition of $Y=X\times(Z/100)$, comprehensively considering the grain growth of the GeSbTe alloy and the formation of carbon aggregates during the manufacturing process.

In the powder mixing, a solvent may be added. Examples of the solvent may include deionized water, alcohol, acetone, and so on. When the solvent is added, it may be removed by performing a drying process after the powder mixing.

The mixed powders may be sintered as they are. Alternatively, the mixed powders may be sintered after being molded into a predetermined target shape.

The sintering process may include one of a sintering process using a furnace, a high temperature pressurized sintering process, a high temperature static pressure sintering process, and a reactive high temperature pressurized sintering process. The sintering process may be performed under an inert gas atmosphere or a reducing gas atmosphere.

The manufacturing process of the sputtering target should be carried out so as to satisfy the condition of $Y=X\times(Z/100)$.

Hereinafter, an electronic device including a phase change recording film or phase change material layer formed by using the sputtering target in accordance with the above-described implementations will be described.

FIG. 1 is a perspective view of a semiconductor memory in accordance with an implementation of the disclosed technology.

The semiconductor memory may have a cross-point structure which includes first lines 110 each extending in a first direction, second lines 150 located over the first lines 110 and each extending in a second direction crossing the first direction, and memory cells 120 located between the first lines 110 and the second lines 150. The memory cells 120 are disposed at respective intersections of the first lines 110 and the second lines 150.

FIGS. 2A to 2D are cross-sectional views illustrating a semiconductor memory and a method for fabricating the semiconductor memory in accordance with an implementation of the disclosed technology.

Figure 2A:
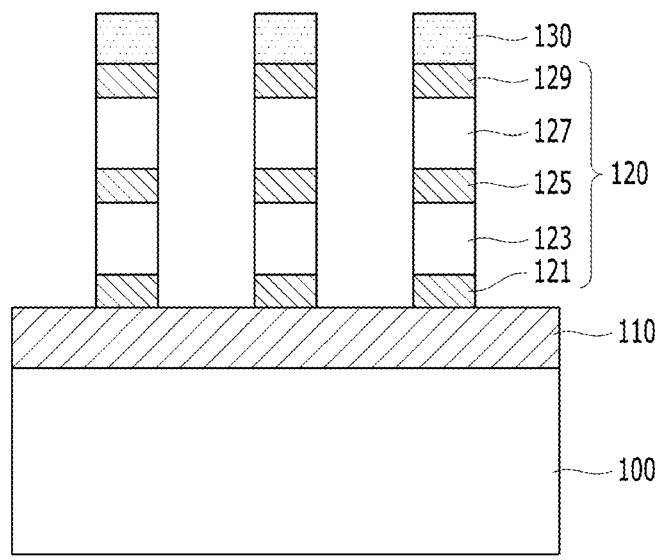
FIGS. 2A to 2D are cross-sectional views illustrating a method for fabricating a semiconductor memory according to an implementation of the disclosed technology.
Figure 2B:
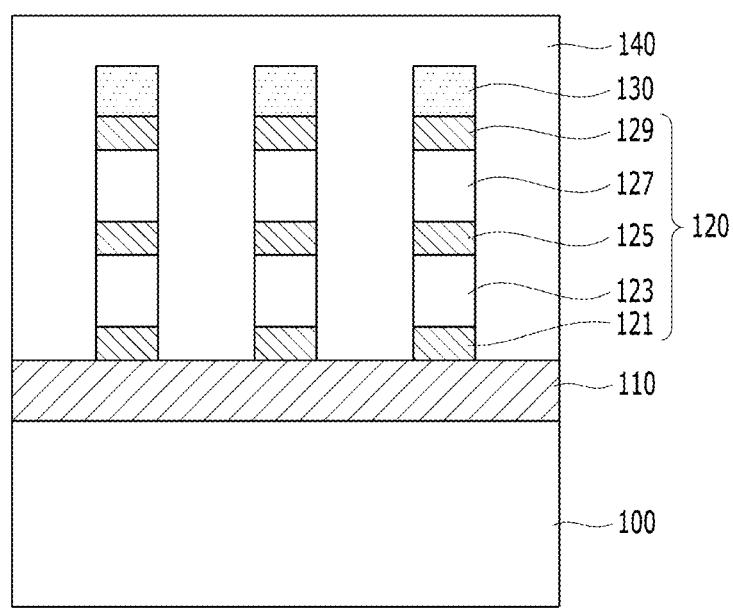
Figure 2C:
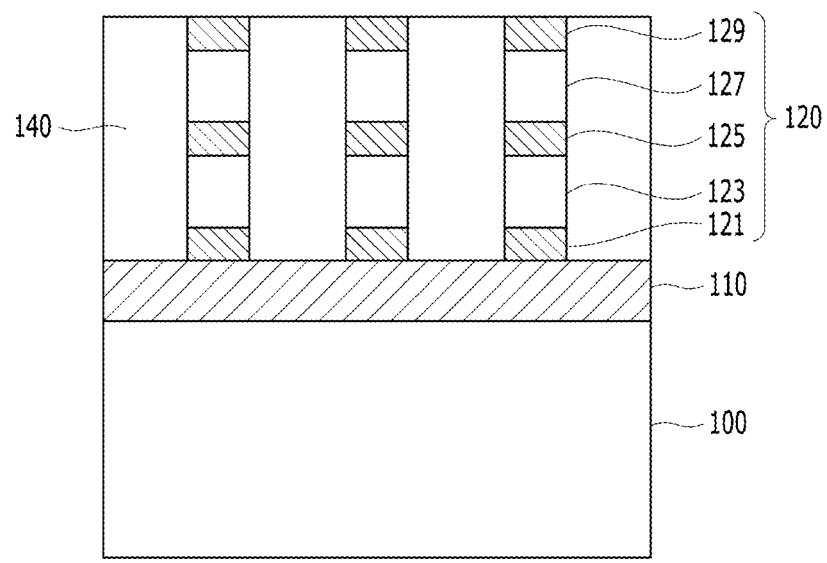
Figure 2D:
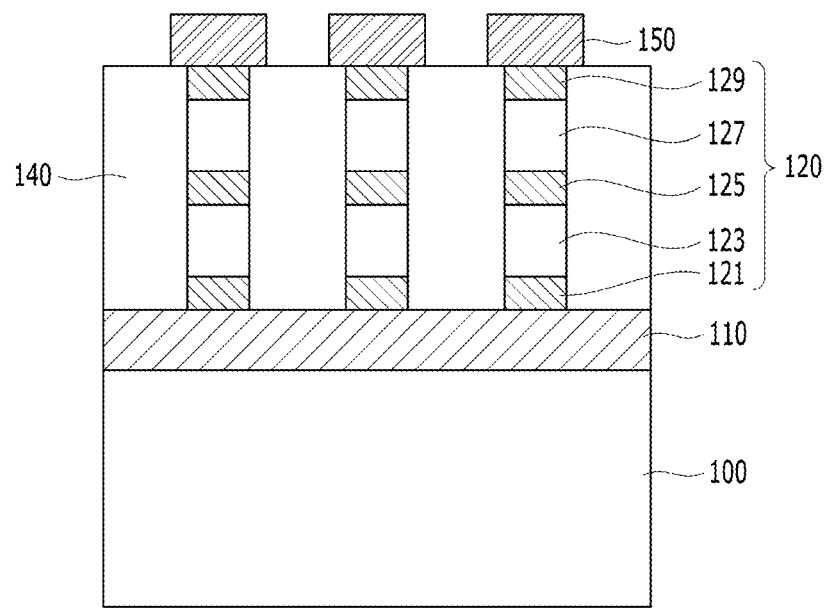

For example, FIG. 2D is a cross-sectional view of the semiconductor device taken along line A-A' of FIG. 1.

Referring to FIG. 2A, a substrate 100 including given structures (not shown) may be provided. For example, the given structures may include one or more transistors for controlling the first lines 110, the second lines 150, or the first and second lines 110 and 150 of FIGS. 1 and 2D, which are formed over the substrate 100.

Then, the first lines 110 each extending in a first direction (e.g., a horizontal direction in FIG. 2A) may be formed over the substrate 100. The first lines 110 may have a single-layered structure or a multi-layered structure, and may include a conductive material such as a metal, a metal nitride, or the like. The first lines 110 may be formed by depositing the conductive material and patterning a deposited conductive material layer. Spaces between the first lines 110 may be filled with an insulating material (not shown).

Then, a plurality of memory cells 120 may be formed over the first lines 110. In the implementation shown in FIG. 2A, each of the plurality of memory cells 120 may have a pillar shape. The plurality of memory cells 120 may be arranged in a matrix having rows and columns. The rows each extend along the first direction and the columns each extend along a second direction crossing the first direction. The memory cells 120 may be disposed in respective intersection regions of the first lines 110 and the second lines 150. For example, the intersection region is a three-dimensional region where the first line 110 and the second line 150 overlap each other when viewed in a plan view. In an implementation, each of the memory cells 120 may have a size that is substantially equal to or smaller than that of the intersection region. In another implementation, each of the memory cells 120 may have a size that is larger than that of the intersection region.

The memory cells 120 may be formed by depositing a plurality of material layers (not shown) over a structure including the first lines 110 and the insulating material (not shown), forming a plurality of hard mask patterns 130 over the plurality of material layers, and etching the material layers using the hard mask patterns 130 as an etching barrier. Therefore, each of the hard mask patterns 130 has sidewalls substantially aligned with sidewalls of a corresponding one of the memory cells 120.

The hard mask patterns 130 may function as an etching barrier while etching the material layers for forming the memory cells 120 and include one or more of various materials having etch selectivity with respect to the memory cells 120. For example, each of the hard mask patterns 130 may have a single-layered structure or a multi-layered structure and include an insulating material such as a silicon oxide, a silicon nitride, a silicon oxynitride, or the like.

Also, in this implementation of FIG. 2A, each of the plurality of memory cells 120 may include a lower electrode layer 121, a selection element layer 123, a middle electrode layer 125, a variable resistance layer 127, and an upper electrode layer 129, which are sequentially stacked over a corresponding first line 110.

Specifically, the lower electrode layer 121 may be located at a lowermost portion of the memory cell 120 and function as a transmission path of a voltage or a current between a corresponding one of the first lines 110 and the remaining portion (e.g., the element layers 123, 125, 127, and 129). The middle electrode layer 125 may physically separate the selection element layer 123 from the variable resistance layer 127, and electrically couple the selection element layer 123 to the variable resistance layer 127. For example, a current flows through the selection element layer 123, the middle electrode layer 125, and the variable resistance layer 127 when a voltage level of a voltage applied across the selection element layer 123 is equal to or greater than a given threshold voltage level.

The upper electrode layer 129 may be located at an uppermost portion of the memory cell 120 and function as a transmission path of a voltage or a current between a corresponding one of the second lines 150 of FIG. 2D and the remaining portion (e.g., the element layers 121, 123, 125, and 127). Each of the lower electrode layer 121, the middle electrode layer 125, and the upper electrode layer 129 may have a single-layered structure or a multi-layered structure and include a conductive material such as a metal, a metal nitride, a conductive carbon material, or the like.

The selection element layer 123 may control access to the variable resistance layer 127. That is, the selection element layer 123 may function as a switching element and have a selection element characteristic for significantly preventing a current from passing through the selection element layer 123 when a magnitude of an applied voltage or an applied current is lower than a critical value (or a threshold value) and causing a current to pass through the selection element layer 123 when the magnitude of the applied voltage or the applied current is substantially equal to or greater than the critical value. For example, a magnitude of the current passing through the selection element layer 123 is proportional to the magnitude of the voltage or current applied to the selection element layer 123.

In some implementations, the selection element layer 123 may include an MIT (metal insulator transition) element such as $NbO_2$ or $TiO_2$; an MIEC (mixed ion-electron conducting) element such as $ZrO_2$ $(Y_2O_3)$, $Bi_2O_3$—BaO, or $(La_2O_3)_x(CeO_2)_{1-x}$; an OTS (ovonic threshold switching) element including a chalcogenide-based material, such as $Ge_2Sb_2Te_5$, $As_2Te_3$, $As_2$, or $As_2Se_3$; a tunneling insulation layer including an insulation material such as a silicon oxide, a silicon nitride, or a metal oxide and allowing tunneling of electrons; or a combination thereof. The selection element layer 123 may have a single-layered structure or a multi-layered structure exhibiting the selection element characteristic with a combination of two or more layers.

The variable resistance layer 127 may switch between different resistance states according to a voltage or a current applied to the variable resistance layer 127 through the upper electrode layer 129 and the middle electrode layer 125, thereby storing data having one of different logic values corresponding to the different resistance states. For example, when the variable resistance layer 127 is in a low resistance state, data having a first logic value of '1' may be stored in the variable resistance layer 127. On the other hand, when the variable resistance layer 127 is in a high resistance state, data having a second logic value of '0' may be stored in the variable resistance layer 127.

The variable resistance layer 127 may include one or more of various materials that are used in RRAM, PRAM, FRAM, MRAM, and the like. For example, the variable resistance layer 127 may include one or more of a metal oxide such as a transition metal oxide or a perovskite-based material, a phase-change material such as a chalcogenide-based material, a ferroelectric material, a ferromagnetic material, and the like. The variable resistance layer 127 may have a single-layered structure or a multi-layered structure showing a variable resistance characteristic with a combination of two or more layers. However, other implementations are also possible. For example, each of the memory cells 120 may include a memory layer capable of storing data in a way different from that of the above-described variable resistance layer 127.

In some implementations, the variable resistance layer 127 may include a phase change material layer formed by using the sputtering target in accordance with the above-described implementations.

Specifically, in one implementation of the disclosed technology, the variable resistance layer 127 may be formed by a sputtering process using a sputtering target that includes a carbon-doped GeSbTe alloy. For the sputtering target, an average grain diameter of the GeSbTe alloy after sintering (X (μm)) is in a range of 0.5 μm to 5 μm, and a ratio of an average grain diameter of carbon after the sintering (Y (μm)) to the average grain diameter of the GeSbTe alloy after the sintering (X (μm)), i.e., Y/X, is a value in a range of greater than 0.5 and equal to or less than 1.5. In accordance with an implementation, it is possible to simultaneously achieve uniformity and refinement of grain sizes of carbon and the GeSbTe alloy in the sintered sputtering target. As a result, in forming the variable resistance layer 127 by the sputtering process, an occurrence of particle defects due to a quality of the sputtering target can be suppressed, thereby significantly improve a film quality of the variable resistance layer 127.

In another implementation, the variable resistance layer 127 may be formed by a sputtering process using a sputtering target that includes a carbon-doped GeSbTe alloy. For the sputtering target, an average grain diameter of the GeSbTe alloy after sintering (X (μm)) and an average grain diameter of carbon after the sintering (Y (μm)), and the carbon content (Z (at %)) satisfy the condition of $Y=X \times (Z/100)$. In accordance with the implementation, it is possible to control a grain size of carbon relative to a grain size of the GeSbTe alloy in the sintered sputtering target according to the doped carbon content. As a result, in forming the variable resistance layer 127 by the sputtering process, an occurrence of particle defects due to a quality of the sputtering target can be suppressed, thereby significantly improve a film quality of the variable resistance layer 127.

Such a sputtering target has been described in detail in the above implementations, the detailed explanation for the chalcogenide material is omitted for the interest of brevity.

In the implementation shown in FIG. 2A, each of the memory cells 120 includes the lower electrode layer 121, the selection element layer 123, the middle electrode layer 125, the variable resistance layer 127, and the upper electrode layer 129. However, implementations are not limited thereto, and the memory cell 120 may have any of various structures. In some implementations, one or more of the lower electrode layers 121, the middle electrode layer 125, and the upper electrode layer 129 may be omitted. In some implementations, the stacked order of the selection element layer 123 and the variable resistance layer 127 may be reversed with respect to the orientation of FIG. 2A, such that the selection element layer 123 may be disposed over the variable resistance layer 127. In some implementations, in addition to the element layers 121, 123, 125, 127, and 129 shown in FIG. 2A, the memory cell 120 may further include one or more layers (not shown) for enhancing characteristics of the memory cell 120, improving fabricating processes, or both.

Two neighboring memory cells of the plurality of memory cells 120 may be spaced apart from each other at a given interval, and trenches may be present between the plurality of memory cells 120. In an implementation, the given interval has a predetermined value, and a trench between two neighboring memory cells 120 may have a height to width ratio (or an aspect ratio) that is in a range from 1:1 to 40:1, from 10:1 to 40:1, from 10:1 to 20:1, from 5:1 to 10:1, from 10:1 to 15:1, from 1:1 to 25:1, from 1:1 to 30:1, from 1:1 to 35:1, or from 1:1 to 45:1.

In some implementations, the trench may have sidewalls that are substantially perpendicular to a top surface of the substrate 100. In some implementations, neighboring trenches may be spaced apart from each other by substantially the same distance. For example, two neighboring trenches in a first direction (e.g., the first direction of FIG. 1) may be spaced apart from each other by substantially the same distance as two neighboring trenches in a second direction (e.g., the second direction of FIG. 1). In some implementations, distances between two neighboring trenches may vary.

Referring to FIG. 2B, an interlayer dielectric layer 140 may be formed over the structure illustrated in FIG. 2A. The interlayer dielectric layer 140 may include one of various insulating materials such as a silicon oxide, a silicon nitride, a silicon oxynitride, and the like. Moreover, the interlayer dielectric layer 140 may be formed along a lower profile, i.e., a profile of the structure illustrated in FIG. 2A. For example, the interlayer dielectric layer 140 is formed over exposed portions of the first lines 110, sidewalls of the memory cells 120, and upper surfaces and sidewalls of the hard mask patterns 130.

Referring to FIG. 2C, a planarization process may be performed on the interlayer dielectric layer 140 until the upper electrode layer 129 is exposed. The planarization process may be performed by a chemical mechanical polishing (CMP) process, an etch process, a cleaning process, or any suitable planarization process. Since the planarization process is performed until upper surfaces of the upper electrode layers 129 of the memory cells 120 are exposed, the hard mask patterns 130 may be removed by the planarization process.

Referring to FIG. 2D, a plurality of second lines 150 may be formed over the memory cells 120 and the interlayer dielectric layer 140. The plurality of second lines 150 may be respectively coupled to upper surfaces of the memory cells 120. Each of the plurality of second lines 150 extends in the second direction crossing the first direction. For example, the second direction may be perpendicular to the line A-A' of FIG. 1. Each of the second lines 150 may have a single-layer structure or a multi-layer structure, and include a conductive material such as a metal, a metal nitride, or the like. The second lines 150 may be formed by depositing a conductive material and patterning a deposited conductive material layer. Spaces between the second lines 150 may be filled with an insulating material (not shown).

Through the processes described above, the semiconductor memory shown in FIG. 2D may be fabricated.

In the implementation shown in FIG. 2D, the semiconductor memory may include the memory cells 120 disposed in the intersection regions of the first lines 110 each extending in the first direction and the second lines 150 each extending in the second direction. In an implementation, the variable resistance layer 127 of the memory cells 120 may be formed by a sputtering process using a sputtering target. In an implementation, the sputtering target includes a carbon-doped GeSbTe alloy in which an average grain diameter of a GeSbTe alloy after sintering (X (μm)) is in a range of 0.5 μm to 5 μm and a ratio of an average grain diameter of carbon after the sintering (Y (μm)) to the average grain diameter of the GeSbTe alloy after the sintering (X (μm)), i.e., Y/X, is a value in a range of greater than 0.5 and equal to or less than 1.5. In another implementation, the sputtering target includes a carbon-doped GeSbTe alloy in which an average grain diameter of a GeSbTe alloy after sintering (X (μm)), an average grain diameter of carbon after the sintering (Y (μm)), and the carbon content (Z (at %)) satisfy the condition of $Y=X \times (Z/100)$.

The memory cells 120 may store data having different values according to a voltage or current applied thereto through the first lines 110 and the second lines 150. In particular, when each of the memory cells 120 includes a variable resistance element, each of the memory cells 120 may store data determined by the variable resistance element switching between different resistance states.

One or more of the first lines 110 each may function as one of a word line and a bit line and one or more of the second lines 150 each may function as the other one of the word line and the bit line.

In the semiconductor memory of FIG. 2D, in forming the variable resistance layer 127 of the memory cell 120, it is possible to effectively suppress an occurrence of particle defects due to a quality of the sputtering target by using the sputtering target including the carbon-doped GeSbTe alloy which can satisfy the above-described specific requirements. Accordingly, characteristics of the variable resistance layer 127 can be stably secured, and thus it is possible to improve a quality and reliability of a device including the variable resistance layer 127.

Figure 3:
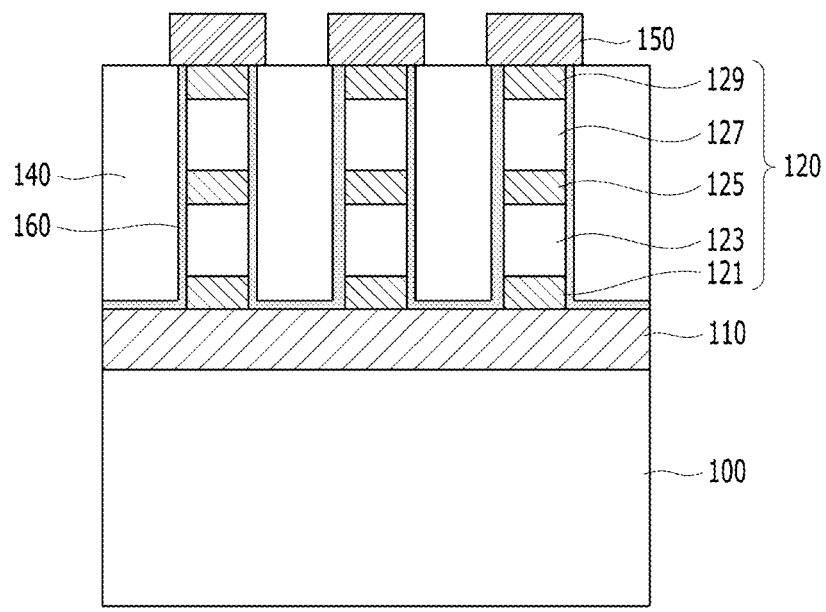
FIG. 3 illustrates a cross-sectional view illustrating a semiconductor memory and a method for fabricating the semiconductor memory according to another implementation of the disclosed technology.

FIG. 3 illustrates a cross-sectional view illustrating a semiconductor memory and a method for fabricating the semiconductor memory according to another implementation of the disclosed technology.

Detailed descriptions for components shown in FIG. 3 that are substantially the same as those of the implementation described above with reference to FIGS. 2A to 2D will be omitted for the interest of brevity.

Referring to FIG. 3, a capping layer 160 may be further formed on sidewalls of the memory cells 120 and over the first lines 110. The capping layer 160 may function to protect the memory cells 120 and have a single-layered structure or a multi-layered structure including any of various insulating materials such as a silicon nitride and the like.

The capping layer 160 may be formed by forming a material layer for the capping layer 160 over the structure of FIG. 2A, for example, on sidewalls of the memory cells 120 and sidewalls and upper surfaces of the hard mask patterns 130 and then performing the processes of FIGS. 2B to 2D. The sidewalls of the memory cells 120 may be in direct contact with the capping layer 160.

As a result, the first lines 110 each extending in a first direction (e.g., the first direction of FIG. 1) and the second lines 150 each extending in a second direction (e.g., the second direction of FIG. 1) are formed over the substrate 100, and the memory cells 120 may be disposed in respective intersection regions of the first lines 110 and the second lines 150. In an implementation, the variable resistance layer 127 of the memory cells 120 may be formed by a sputtering process using a sputtering target including a carbon-doped GeSbTe alloy in which an average grain diameter of the GeSbTe alloy after sintering (X (μm)) is in a range of 0.5 μm to 5 μm and a ratio of and an average grain diameter of carbon after the sintering (Y (μm)) to the average grain diameter of the GeSbTe alloy after the sintering (X (μm)), i.e., Y/X, is a value in a range of greater than 0.5 and equal to or less than 1.5, or using a sputtering target including a carbon-doped GeSbTe alloy in which an average grain diameter of the GeSbTe alloy after sintering (X (μm)), an average grain diameter of carbon after sintering (Y (μm)), and the carbon content (Z (at %)) satisfy the condition of $Y = X \times (Z/100)$.

In the implementations shown in FIGS. 1 to 3, the semiconductor memory having a single-layer cross-point structure has been described. However, in another implementation, a semiconductor memory may have a multi-layer cross-point structure in which two or more cross-point structures may be stacked in a third direction perpendicular to the first and second directions. Each of the two or more cross-point structures may include first lines 110, second lines 150, and memory cells 120 located at respective intersections of the first lines 110 and the second lines 150.

The above and other semiconductor memories based on the disclosed technology can be used in electronic devices or systems. FIGS. 4-7 provide some examples of electronic devices or systems that include the semiconductor memory disclosed herein.

Figure 4:
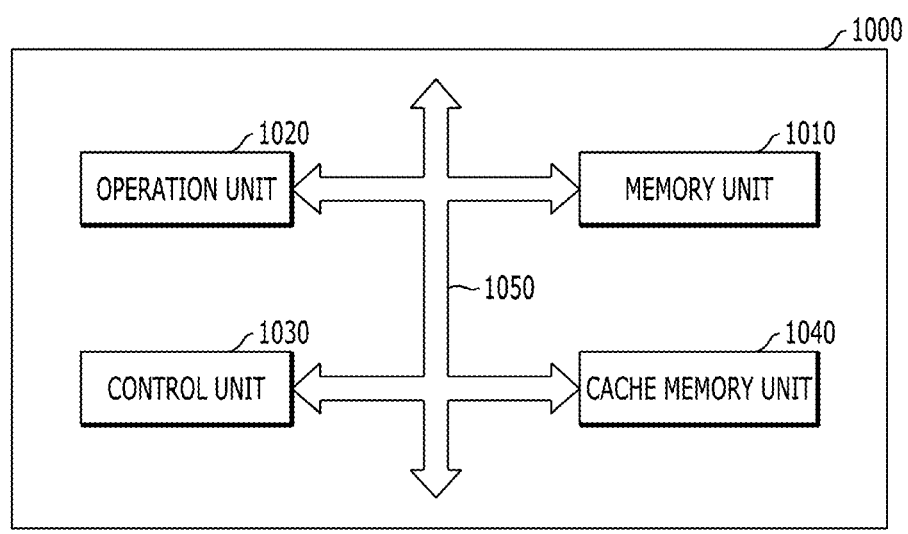
FIG. 4 illustrates a microprocessor that includes a semiconductor memory according to an implementation of the disclosed technology.

FIG. 4 illustrates a microprocessor 1000 that includes the semiconductor memory based on the disclosed technology.

Referring to FIG. 4, the microprocessor 1000 may perform tasks for controlling and tuning a series of processes of receiving data from various external devices, processing the data, and outputting processing results to the external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP), and an application processor (AP).

The memory unit 1010 stores data in the microprocessor 1000 as a processor register, a register, or the like. The memory unit 1010 may include various registers such as a data register, an address register, a floating point register, and so on. The memory unit 1010 may temporarily store data for which operations are to be performed by the operation unit 1020, result data of performing the operations, and addresses of a memory region where the data for performing of the operations are stored.

The memory unit 1010 may include one or more of the above-described semiconductor memories in accordance with the implementations. For example, the memory unit 1010 may be formed by a method that includes forming a first electrode layer over a substrate, forming a phase change material layer including a carbon-doped GeSbTe alloy over the first electrode layer, and forming a second electrode layer over the phase change material layer, wherein the phase change material layer is formed by a sputtering process using a sputtering target. The sputtering target includes the carbon-doped GeSbTe alloy. For the carbon-doped GeSbTe alloy, an average grain diameter of a GeSbTe alloy after sintering is in a range of 0.5 μm to 5 μm, and a first ratio of an average grain diameter of carbon after the sintering to the average grain diameter of the GeSbTe alloy after the sintering may be a value in a range of greater than 0.5 and equal to or less than 1.5. Alternatively, for the carbon-doped GeSbTe alloy, a condition of $Y = X \times (Z/100)$ may be satisfied, where an average grain diameter of a GeSbTe alloy after sintering is X (μm), an average grain diameter of carbon after the sintering is Y (μm), and a content of carbon is Z (at %). Through this, when forming the memory unit 1010, an occurrence of particle defects due to a quality of the sputtering target can be suppressed, and thus a quality of thin films formed by the sputtering process can be significantly improved. As a consequence, it is possible to improve an electrical characteristic and an operational characteristic of the memory unit 1010 and to secure reliability of the memory unit 1010.

Therefore, it is also possible to improve an electrical characteristic and an operational characteristic of the microprocessor 1000 and to secure reliability of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020, and an external device of the microprocessor 1000, perform extraction, decoding of commands, and controlling input and output of signals of the microprocessor 1000, and execute processing represented by programs.

The microprocessor 1000 may additionally include a cache memory unit 1040 which can temporarily store data inputted from an external device other than the memory unit 1010 or data to be outputted to an external device. In this case, the cache memory unit 1040 may exchange data with the memory unit 1010, the operation unit 1020, and the control unit 1030 through a bus interface 1050.

Figure 5:
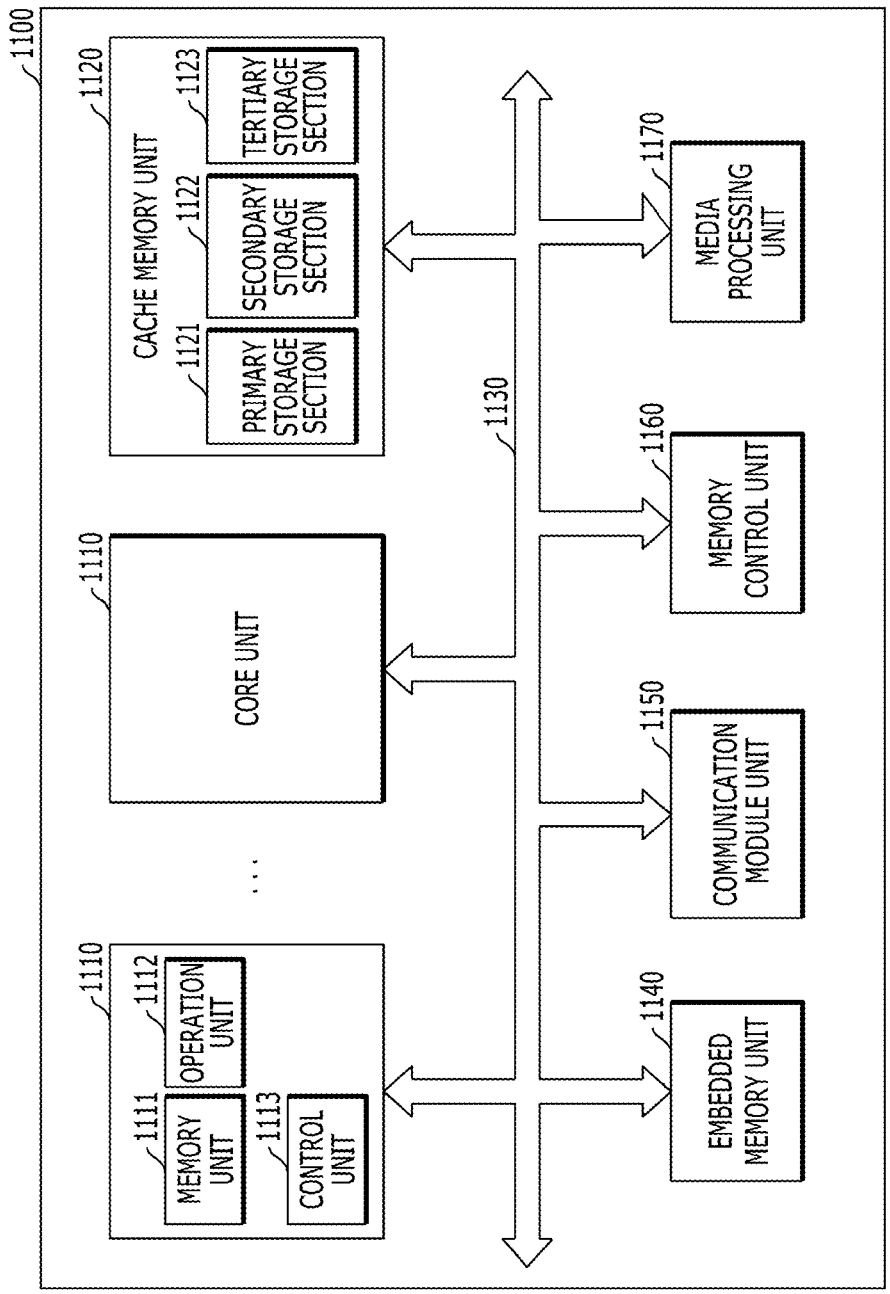
FIG. 5 illustrates a processor that includes a semiconductor memory according to an implementation of the disclosed technology.

FIG. 5 illustrates a processor 1100 that includes the semiconductor memory based on the disclosed technology.

Referring to FIG. 5, the processor 1100 may improve performance and realize multi-functionality by including various functions in addition to those of the above-described microprocessor 1000. The processor 1100 may include a core unit 1110 which serves as a microprocessor, a cache memory unit 1120 which serves to store data temporarily, and a bus interface 1130 for transferring data between internal and external devices. The processor 1100 may include various system-on-chips (SoCs) such as a multi-core processor, a graphic processing unit (GPU), and an application processor (AP).

The core unit 1110 may perform arithmetic logic operations for data inputted from an external device, and may include a memory unit 1111, an operation unit 1112, and a control unit 1113. The memory unit 1111, the operation unit 1112, and the control unit 1113 may be substantially the same as the memory unit 1010, the operation unit 1020, and the control unit 1030 included in the microprocessor 1000 of FIG. 4.

The cache memory unit 1120 temporarily stores data to compensate for a difference in data processing speeds between the core unit 1110 operating at a high speed and an external device operating at a low speed. The cache memory unit 1120 may include a primary storage section 1121 and a secondary storage section 1122. Further, the cache memory unit 1120 may include a tertiary storage section 1123 in the case where high storage capacity is required. As the occasion demands, the cache memory unit 1120 may include an increased number of storage sections. That is to say, the number of storage sections included in the cache memory unit 1120 may be changed according to a design. The speeds at which the primary, secondary, and tertiary storage sections 1121, 1122, and 1123 store and discriminate data may be the same or different. In the case where the speeds of the respective storage sections 1121, 1122, and 1123 are different, the speed of the primary storage section 1121 may be largest among the storage sections 1121, 1122, and 1123. At least one storage section of the primary storage section 1121, the secondary storage section 1122, and the tertiary storage section 1123 of the cache memory unit 1120 may include one or more of the above-described semiconductor memories in accordance with the implementations.

For example, the cache memory unit 1120 may be formed by a method that includes forming a first electrode layer over a substrate, forming a phase change material layer including a carbon-doped GeSbTe alloy over the first electrode layer, and forming a second electrode layer over the phase change material layer. The phase change material layer is formed by a sputtering process using a sputtering target. The sputtering target includes the carbon-doped GeSbTe alloy. For the carbon-doped GeSbTe alloy, an average grain diameter of a GeSbTe alloy after sintering is in a range of 0.5 µm to 5 µm, and a first ratio of an average grain diameter of carbon after the sintering to the average grain diameter of the GeSbTe alloy after the sintering may be a value in a range of greater than 0.5 and equal to or less than 1.5. Alternatively, for the carbon-doped GeSbTe alloy, a condition of $Y=X\times(Z/100)$ may be satisfied, where an average grain diameter of a GeSbTe alloy after sintering is X (µm), an average grain diameter of carbon after the sintering is Y (µm), and a content of carbon is Z (at %). Through this, when forming the cache memory unit 1120, an occurrence of particle defects due to a quality of the sputtering target can be suppressed, and a quality of thin films formed by the sputtering process can be significantly improved. As a consequence, it is possible to improve an electrical characteristic and an operational characteristic of the processor 1100 and to secure reliability of the processor 1100.

Although it was shown in this implementation that all the primary, secondary, and tertiary storage sections 1121, 1122, and 1123 are configured inside the cache memory unit 1120, at least one of the primary, secondary, and tertiary storage sections 1121, 1122, and 1123 of the cache memory unit 1120 may be configured outside the core unit 1110 and may compensate for a difference in data processing speeds between the core unit 1110 and the external device.

The bus interface 1130 connects the core unit 1110, the cache memory unit 1120, and an external device, and allows data to be efficiently transmitted between those components.

The processor 1100 may include a plurality of core units 1110, and the plurality of core units 1110 may share the cache memory unit 1120. The plurality of core units 1110 and the cache memory unit 1120 may be directly connected to each other or be connected through the bus interface 1130. Each of the plurality of core units 1110 may be configured in the same way as the above-described configuration of the core unit 1110. Storage sections in each of the core units 1110 may be configured to be shared with storage sections outside the core units 1110 through the bus interface 1130.

The processor 1100 may further include an embedded memory unit 1140 which stores data, a communication module unit 1150 which transmits and receives data to and from an external device in a wired or wireless manner, a memory control unit 1160 which drives an external memory device, and a media processing unit 1170 which processes data processed in the processor 1100 or data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include any of a DRAM (dynamic random access memory), a mobile DRAM, an SRAM (static random access memory), and a memory with similar functions to above mentioned memories. The nonvolatile memory may include any of a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions to above mentioned memories.

The communication module unit 1150 may include a module capable of being connected with a wired network, a module capable of being connected with a wireless network, or both of them. The wired network module may include one or more of a local area network (LAN), a universal serial bus (USB), an Ethernet, power line communication (PLC) such as various devices which send and receive data through transmit lines, and so on. The wireless network module may include one or more of Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a communication standard different from that of the processor 1100. The memory control unit 1160 may include one or more of various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or data inputted in the form of image, voice, and others from the external input device and output the processed data to the external interface device. The media processing unit 1170 may include one or more of a graphic processing unit (GPU), a digital signal processor (DSP), a high definition audio device (HD audio), a high definition multimedia interface (HDMI) controller, and so on.

Figure 6:
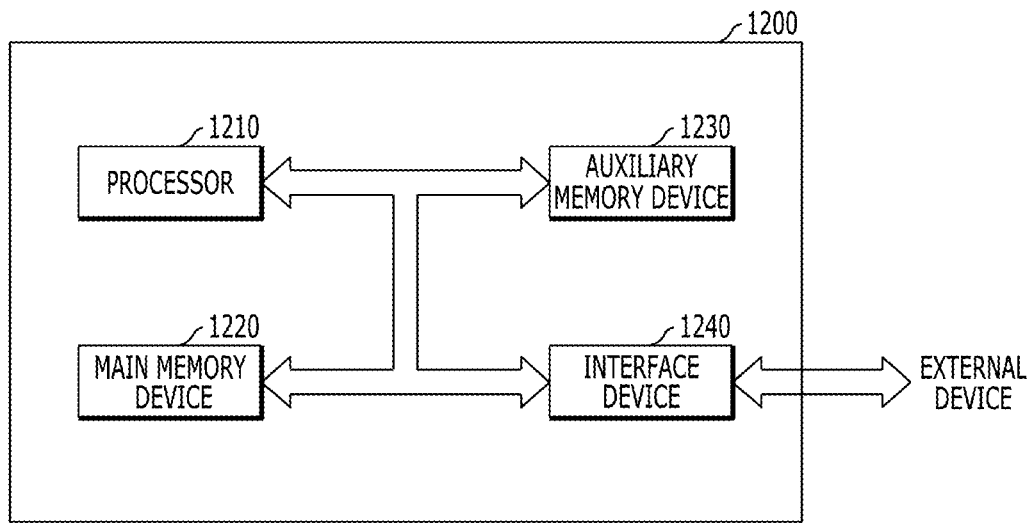
FIG. 6 illustrates a system that includes a semiconductor memory according to an implementation of the disclosed technology.

FIG. 6 illustrates a system 1200 implementing the semiconductor memory based on the disclosed technology.

Referring to FIG. 6, the system 1200 as an apparatus for processing data may perform inputting, processing, outputting, communication, storage, etc. to conduct a series of manipulations for data. The system 1200 may include a processor 1210, a main memory device 1220, an auxiliary memory device 1230, an interface device 1240, and so on. The system 1200 may be one of various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operations for data stored in the system 1200, and controls these operations. The processor 1210 may substantially the same as the above-described microprocessor 1000 of FIG. 4 or the above-described processor 1100 of FIG. 5.

The main memory device 1220 is a storage which can temporarily store, call, and execute program codes or data from the auxiliary memory device 1230 when programs are executed, and can conserve memorized contents even when power supply is cut off. The auxiliary memory device 1230 is a memory device for storing the program codes or data. While a processing speed of the auxiliary memory device 1230 is slower than that of the main memory device 1220, the auxiliary memory device 1230 can store a larger amount of data. The main memory device 1220 or the auxiliary memory device 1230 may include one or more of the above-described semiconductor memories in accordance with the implementations. For example, the main memory device 1220 or the auxiliary memory device 1230 may be formed by a method that includes forming a first electrode layer over a substrate, forming a phase change material layer including a carbon-doped GeSbTe alloy over the first electrode layer, and forming a second electrode layer over the phase change material layer. The phase change material layer is formed by a sputtering process using a sputtering target. The sputtering target includes the carbon-doped GeSbTe alloy. For the carbon-doped GeSbTe alloy, an average grain diameter of a GeSbTe alloy after sintering is in a range of 0.5 μm to 5 μm, and a first ratio of an average grain diameter of carbon after the sintering to the average grain diameter of the GeSbTe alloy after the sintering may be a value in a range of greater than 0.5 and equal to or less than 1.5. Alternatively, for the carbon-doped GeSbTe alloy, a condition of $Y=X \times (Z/100)$ may be satisfied, where an average grain diameter of a GeSbTe alloy after sintering is X (μm), an average grain diameter of carbon after the sintering is Y (μm), and a content of carbon is Z (at %) Through this, when forming the main memory device 1220 or the auxiliary memory device 1230, an occurrence of particle defects due to a quality of the sputtering target can be suppressed, and a quality of thin films formed by the sputtering process can be significantly improved. As a consequence, it is possible to improve an electrical characteristic and an operational characteristic of the system 1200 and to secure reliability of the system 1200.

Also, the main memory device 1220 or the auxiliary memory device 1230 may include a memory system (see reference numeral 1300 of FIG. 7) in addition to the above-described semiconductor memory or without including the above-described semiconductor memory.

The interface device 1240 may be used to exchange commands and data between the system 1200 and an external device. The interface device 1240 may include one or more of a keypad, a keyboard, a mouse, a speaker, a mike, a display, one of various human interface devices (HIDs), a communication device, and so on. The communication device may be substantially the same as the above-described communication module unit 1150 of FIG. 5.

Figure 7:
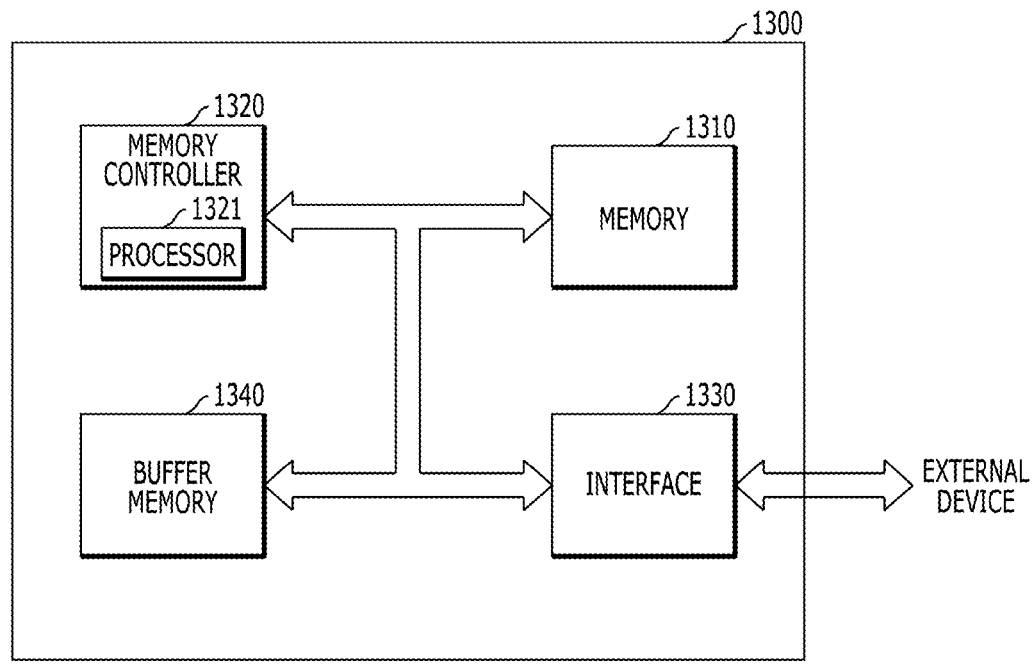
FIG. 7 illustrates a memory system that includes a semiconductor memory according to an implementation of the disclosed technology.

FIG. 7 illustrates a memory system 1300 that includes the semiconductor memory based on the disclosed technology.

Referring to FIG. 7, the memory system 1300 may include a memory 1310 which has a nonvolatile characteristic as a component for storing data, a memory controller 1320 which controls the memory 1310, an interface 1330 for connection with an external device, and a buffer memory 1340 temporarily storing data for efficient data transfer between the interface 1330 and the memory 1310. The memory system 1300 may be a data storage device for conserving stored data in a long term. The memory system 1300 may be a disk type storage device such as a solid state disk (SSD), or a card type storage device such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, or the like.

The memory 1310 or the buffer memory 1340 may include one or more of the above-described semiconductor memories in accordance with the implementations. For example, the memory 1310 or the buffer memory 1340 may be formed by a method that includes forming a first electrode layer over a substrate, forming a phase change material layer including a carbon-doped GeSbTe alloy over the first electrode layer, and forming a second electrode layer over the phase change material layer. The phase change material layer is formed by a sputtering process using a sputtering target. The sputtering target includes the carbon-doped GeSbTe alloy. For the carbon-doped GeSbTe alloy, an average grain diameter of a GeSbTe alloy after sintering is in a range of 0.5 μm to 5 μm, and a first ratio of an average grain diameter of carbon after the sintering to the average grain diameter of the GeSbTe alloy after the sintering may be a value in a range of greater than 0.5 and equal to or less than 1.5. Alternatively, for the carbon-doped GeSbTe alloy, a condition of Y=X×(Z/100) may be satisfied, where an average grain diameter of a GeSbTe alloy after sintering is X (μm), an average grain diameter of carbon after the sintering is Y (μm), and a content of carbon is Z (at %). Through this, when forming the memory 1310 or the buffer memory 1340, an occurrence of particle defects due to a quality of the sputtering target can be suppressed, and thus a quality of thin films formed by the sputtering process can be significantly improved. As a consequence, it is possible to improve an electrical characteristic and an operational characteristic of the memory system 1300 and to secure reliability of the memory system 1300.

The memory 1310 or the buffer memory 1340 may include one or more of various memories such as a nonvolatile memory and a volatile memory, in addition to the above-described semiconductor memory or without including the above-described semiconductor memory.

The controller 1320 may control exchange of data between the memory 1310 and the interface 1330. To this end, the controller 1320 may include a processor 1321 for performing an operation for processing commands inputted through the interface 1330 from an outside of the memory system 1300 and so on.

The interface 1330 is used to exchange commands and data between the memory system 1300 and an external device. In the case where the memory system 1300 is a card type storage device or a disk type storage device, the interface 1330 may be compatible with interfaces which are used in devices having a card type or a disk type, or be compatible with interfaces which are used in devices similar to the above mentioned devices. The interface 1330 may be compatible with one or more interfaces having a different type from each other.

Features in the above examples of electronic devices or systems in FIGS. 4-7 may be implemented in various devices, systems, or applications. Some examples include mobile phones or other portable communication devices, tablet computers, notebooks, or laptop computers, game machines, smart TV sets, TV set top boxes, multimedia servers, digital cameras with or without wireless communication functions, wrist watches, or other wearable devices with wireless communication capabilities.

Only a few implementations and examples are described above. Accordingly, other implementations, enhancements, and variations can be made based on what is described and illustrated in this patent document.

What is claimed is:

1. A method for fabricating an electronic device including a semiconductor memory, the method comprising:
    forming a plurality of first lines over a substrate, each first line extending in a first direction;
    forming a plurality of memory cells over the first lines; and
    forming a plurality of second lines over the memory cells, each second line extending in a second direction that crosses the first direction, the first and second directions being perpendicular to a top surface of the substrate,
    wherein forming the plurality of memory cells comprises:
        forming a plurality of lower electrode layers over the first lines;
        forming a plurality of selection element layers over the plurality of lower electrode layers;
        forming a plurality of middle electrode layers over the plurality of selection element layers;
        forming a plurality of variable resistance layers over the plurality of middle electrode layers; and
        forming a plurality of upper electrode layers over the plurality of variable resistance layers,
    wherein the memory cells are disposed at respective intersections of the plurality of first lines and the plurality of second lines,
    wherein the lower electrode layers are configured to carry a voltage or a current between a corresponding one of the first lines and said each of the memory cells,
    wherein the selection element layers are configured to control accessing to the variable resistance layers,
    wherein the middle electrode layers are configured to physically separate the selection element layers from the variable resistance layers and to electrically couple the selection element layers to the variable resistance layers,
    wherein the variable resistance layers are configured to switch between different resistance states according to an applied voltage or current,
    wherein each of the upper electrode layers is configured to provide a transmission path of a voltage or a current between said each of the variable resistance layers and a corresponding one of the second lines,
    wherein the variable resistance layers are formed by a sputtering process using a sputtering target, the sputtering target including a carbon-doped GeSbTe alloy, and
    wherein an average grain diameter of a GeSbTe alloy after sintering is in a range of 0.5 μm to 5 μm, and a first ratio of an average grain diameter of carbon after the sintering to the average grain diameter of the GeSbTe alloy after the sintering is in a range of greater than 0.5 and equal to or less than 1.5.

2. The method of claim 1, wherein the selection element layer has a single-layered structure, or a multi-layered structure that exhibits a selection element characteristic using a combination of two or more layers.

3. The method of claim 1, wherein the first ratio is in a range of 0.8 to 1.2.

4. The method of claim 1, wherein the carbon-doped GeSbTe alloy is formed using 5 to 25 at % of germanium, 20 to 40 at % of antimony, 40 to 60 at % of tellurium, and 0.1 to 20 at % of carbon.

5. The method of claim 1, wherein a second ratio of an average powder diameter of carbon before the sintering to an average powder diameter of the GeSbTe alloy before the sintering is in a range of greater than 0.5 and equal to or less than 1.5.

6. The method of claim 5, wherein the second ratio is in a range of 0.8 to 1.2.

7. A method for fabricating an electronic device including a semiconductor memory, the method comprising:
    forming a plurality of first lines over a substrate, each first line extending in a first direction;
    forming a plurality of memory cells over the first lines; and
    forming a plurality of second lines over the memory cells, each second line extending in a second direction that crosses the first direction, the first and second directions being perpendicular to a top surface of the substrate, wherein forming the plurality of memory cells comprises:
- forming a plurality of lower electrode layers over the first lines;
- forming a plurality of selection element layers over the plurality of lower electrode layers;
- forming a plurality of middle electrode layers over the plurality of selection element layers;
- forming a plurality of variable resistance layers over the plurality of middle electrode layers; and
- forming a plurality of upper electrode layers over the plurality of variable resistance layers, wherein the memory cells are disposed at respective intersections of the plurality of first lines and the plurality of second lines, wherein the lower electrode layers are configured to carry a voltage or a current between a corresponding one of the first lines and said each of the memory cells, wherein the selection element layers are configured to control accessing to the variable resistance layers, wherein the middle electrode layers are configured to physically separate the selection element layers from the variable resistance layers and to electrically couple the selection element layers to the variable resistance layers, wherein the variable resistance layers are configured to switch between different resistance states according to an applied voltage or current, wherein each of the upper electrode layers is configured to provide a transmission path of a voltage or a current between said each of the variable resistance layers and a corresponding one of the second lines, wherein the variable resistance layers are formed by a sputtering process using a sputtering target, the sputtering target including a carbon-doped GeSbTe alloy, wherein, for the carbon-doped GeSbTe alloy, a condition of $Y=X \times (Z/100)$ is satisfied, and wherein an average grain diameter of a GeSbTe alloy after sintering is X (μm), an average grain diameter of carbon after the sintering is Y (μm), and a content of carbon is Z (at %).

8. The method of claim 7, wherein the selection element layer has a single-layered structure, or a multi-layered structure that exhibits a selection element characteristic using a combination of two or more layers.

9. The method of claim 7, wherein the average grain diameter of the GeSbTe alloy after the sintering is in a range of 0.5 μm to 30 μm.

10. The method of claim 7, wherein the carbon-doped GeSbTe alloy includes 5 to 25 at % of germanium, 20 to 40 at % of antimony, 40 to 60 at % of tellurium, and 0.1 to 20 at % of carbon.

* * * * *